United States Patent [19]

Sumner et al.

[11] 4,197,502

[45] Apr. 8, 1980

[54] DIGITAL SIGNAL DETECTOR

[75] Inventors: Terence E. Sumner; Charles A. Backof, Jr., both of Hoffman Estates, Ill.

[73] Assignee: Motorola, Inc., Schaumburg, Ill.

[21] Appl. No.: 951,896

[22] Filed: Oct. 16, 1978

[51] Int. Cl.$^2$ ............................................. H04B 1/10
[52] U.S. Cl. .................................... 375/75; 307/232; 307/233 R; 328/141
[58] Field of Search ......................... 307/232, 233 R; 328/133, 138, 165, 109, 72, 141; 325/321, 322, 323, 325; 179/1 MN; 178/88

[56] References Cited

U.S. PATENT DOCUMENTS

| | | | |
|---|---|---|---|
| 3,278,759 | 10/1966 | Rekiere | 307/233 R |
| 3,437,937 | 4/1969 | Warnfield | 325/321 |
| 3,526,841 | 9/1970 | Holmboe et al. | 307/233 |
| 3,723,890 | 3/1973 | Hutsinger | 325/321 |
| 3,927,260 | 12/1975 | Amundson et al. | 307/232 |
| 3,939,431 | 2/1976 | Cohlman | 325/478 |
| 3,995,225 | 11/1976 | Horn | 329/106 |
| 4,080,572 | 5/1978 | Hastings et al. | 325/321 |

Primary Examiner—Marc E. Bookbinder
Assistant Examiner—Peter Durigon
Attorney, Agent, or Firm—Rolland R. Hackbart; James W. Gillman

[57] ABSTRACT

A digital signal detector is disclosed that detects a serial bit stream transmitted at a predetermined bit frequency. Bit transitions are totallized in a counter over a predetermined time interval. Bit transitions occurring during a good window interval increment the totallized count by one. Bit transitions occurring during a bad window interval decrement the totallized count by one. Bit transitions occurring during a marginal window interval, situated between the good and bad window intervals, do not affect the totallized count. If the counter reaches a predetermined count during the time interval, a detect signal is provided indicating that the digital signal has been detected. The counter can be further loaded with a threshold count for tailoring the digital signal detector for operation at a particular signal-to-noise ratio. Periodic signals that have frequencies that are submultiples of the bit frequency are detected by correlating the digital signal between two predetermined stages of a shift register. The digital signal detector may provide a detector output signal when both the digital signal is detected and periodic signals having submultiple frequencies are not present.

20 Claims, 2 Drawing Figures

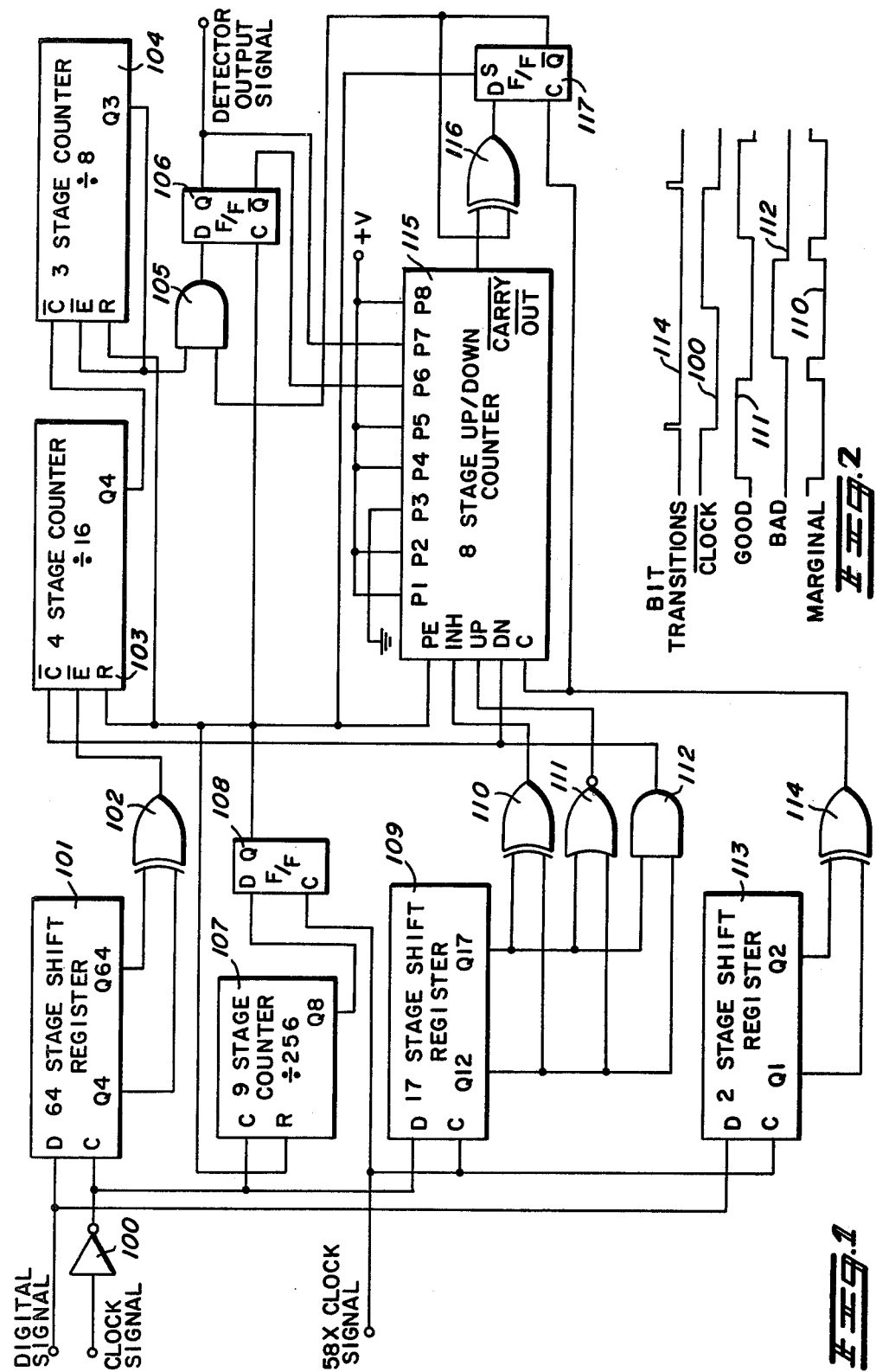

DIGITAL SIGNAL DETECTOR

TECHNICAL FIELD

The present invention relates to signal detectors, and more particularly, to an improved detector for digital signals transmitted in serial bit streams.

BACKGROUND ART

Digital signal detectors of the prior art have utilized various techniques which make use of the fact that bit transitions occur in a predictable timing relationship with respect to one another. For example, in U.S. Pat. No. 3,939,431, there is described a detector which generates a window pulse at a predetermined time interval from the preceding bit transition, which time interval is one of two times depending on whether the preceding bit transition was a high to low, or low to high logical state change. If bit transitions occur during the window pulse, the detector provides an indication that the digital signal is present.

Another digital signal detector is described in U.S. Pat. No. 3,995,225, where a quadrature detector is combined with minimum and maximum bit width detectors. When the digital signal is present, bit transitions do not occur in quadrature with the recovered clock signal. Therefore, if bit transitions are detected in quadrature with the clock signal, noise and not the digital signal is present. Furthermore, if bit transitions are too close together or too far apart, noise is likewise determined to be present. However, neither of the foregoing detectors provides for variability of the detector threshold such that the sensitivity of the detector may be tailored to a particular communication channel. Moreover, neither of the prior art detectors provide hysteresis in the detector threshold, such that the threshold may be reduced subsequent to an initial detection of the digital signal. In addition, neither of the foregoing detectors can be rendered substantially immune to periodic signals having frequencies that are submultiples of the bit frequency of the digital signal.

SUMMARY OF THE INVENTION

It is an object of the present invention to provide an improved detector for digital signals transmitted in serial bit streams at a predetermined bit frequency by a clock signal.

It is another object of the present invention to provide an improved digital signal detector that has a variable threshold for adjusting the detector sensitivity.

It is a further object of the present invention to provide an improved digital signal detector that is substantially immune to periodic signals having submultiple frequencies of the bit frequency.

It is yet a further object of the present invention to provide an improved digital signal detector that provides for hysteresis in the detector threshold.

In practicing the invention, there is provided a detector for detecting digital signals transmitted in serial bit streams at a predetermined bit frequency by a clock signal and providing an indication signal that the digital signal is present. The detector includes a first counter responsive to the clock signal for providing a reset pulse signal at the end of each N bit interval, where N is an integer. A transition detector provides a transition pulse signal for each change in logical state between successive bits of the digital signal. A window generator repetitively generates a plurality of window signals during each bit interval. Each of the window signals has a corresponding weighted value associated with it. The weighted value for each window signal is predeterminedly related to the probability of bit transitions occurring in the interval of the respective window signal. For example, the weighted value associated with a window signal whose interval is located in synchronism with the expected bit transitions will be relatively high, as compared to the weighted value for a window signal whose interval is located in quadrature with the expected bit transitions.

A second counter provides for each N bit interval a totallized count formed by totallizing for each transition pulse signal, the weighted value corresponding to the window signal during which the respective transition pulse signal occurs. A comparator then compares each totallized count to a reference count and provides an indication signal indicating that the digital signal is present when the respective totallized count is greater than the threshold count. The comparator may be further characterized in that the threshold count is reduced subsequent to a comparison where the totallized count is greater than the threshold count.

According to another feature of the present invention, a periodic signal detector may be provided for detecting periodic signals, such as tones, that have submultiple frequencies of the bit frequency. Each of the periodic signals has a period that is 2 N times the period of the bit frequency, where N is an integer. The number of periodic signals that may false the digital signal detector may be limited by selection of the threshold count. The periodic signal detector includes a first register having a predetermined number of stages. The first register serially receives the digital signal in response to the clock signal. The first register provides first and second delayed bits, $B_I$ and $B_{I+M}$, respectively, where I and M are integers. The second delayed bit is delayed relative to the first delayed bit by M stages, where M is the lowest common multiple (LCM) of the factors 2 N for each of the periodic signals to be detected. By proper selection of the threshold count, periodic signals having submultiple frequencies less than a predetermined minimum frequency will not be detected. Therefore, the LCM is determined by the factors 2 N for only those periodic signals that may falsely be detected by the digital signal detector.

The first and second delayed bits are combined by gating circuitry, which may provide an output pulse signal when the first and second delayed bits have the same logical state. A counter is coupled to the gating circuitry for providing totallized counts of the gating-circuitry output signals occurring between successive reset pulse signals. A comparator compares each totallized count to a reference count and provides an indication signal that a periodic signal is present when the respective totallized count is greater than the threshold count. Alternatively, the gating circuitry may provide an output pulse signal when the first and second delayed bits have the opposite logical state. In this case, the comparator provides the indication signal when each totallized count is less than the threshold count.

BRIEF DESCRIPTION OF THE DRAWINGS

FIG. 1 shows a block diagram of a digital signal detector embodying the present invention.

FIG. 2 illustrates waveforms provided by corresponding blocks of the digital signal detector of FIG. 1.

DETAILED DESCRIPTION OF THE INVENTION

In FIG. 1, there is illustrated an embodiment of the present invention. The digital signal detector receives a digital signal, a clock signal and a high speed clock signal, both clock signals being recovered from the digital signal, and provides a detector output signal indicating the presence of the digital signal. The digital signal may be provided in a serial bit stream transmitted at a predetermined bit frequency by the clock signal. For example, the clock signal may be provided at 12 KHz, while the high speed clock signal is provided at 696 KHz, or 58 times the frequency of the clock signal. The clock signal and high speed clock signal may be recovered from the digital signal by a conventional digital phase-locked loop, as is known in the art (e.g. see U.S. Pat. No. 3,883,817). Such a digital phase-locked loop is synchronized to the bit transitions of the digital signal.

The present invention may be advantageously utilized in a communication system where a communication channel may carry both voice signals and digital signals. A receiver in such a communication system requires both a voice squelch circuit and a data squelch circuit in order to properly squelch the receiver output and appropriately route audio and digital signals. The digital signal detector of the present invention provides a detector output signal that may be utilized as the data squelch signal in such a communications system. The digital signal detector of the present invention reliably discriminates between a digital signal and non-periodic signals, such as voice and noise, and periodic signals such as audio tones. The digital signal detector of the present invention may be advantageously utilized in a receiver voting system, such as that described in co-pending U.S. patent application, Ser. No. 951,895, entitled "Delta Modulated Digital Signal Detector", by Alan L. Wilson et al, and filed on the same day as, and assigned to the same assignee as, the instant application. The foregoing receiver voting system utilizes the detector of the present invention to discriminate between clear audio signals and digitally coded audio signals.

In FIG. 1, there is illustrated an embodiment of the present invention that is realized entirely from digital circuits. The digital signal detector includes time interval generating circuitry 107-108, periodic signal detecting circuitry 101-104, bit-transition detecting circuitry 109-117 and detector output circuitry 105-106.

The time interval generating circuitry 107-108 consists of a nine stage counter 107 and a delay flip-flop 108. Stage Q8 of the counter 107 goes to a logic high state after 256 cycles of the clock signal. The delay flip-flop 108, being clocked by the high speed clock signal, provides a relatively narrow reset pulse signal after every 256 cycles of the clock signal. The reset pulse signal resets all stages of the counter 107 to an initial zero state, and the foregoing operation is then repeated. Since the clock signal in the preferred embodiment is 12 KHz, reset pulse signals are provided approximately every 21.3 ms.

The bit-transition detecting circuitry 109-117 includes window generating circuitry 109-112, bit-transition pulse generating circuitry 113-114 and bit-transition counting circuitry 115-117. The window generating circuitry includes a 17 stage shift register 109, an EXCLUSIVE OR gate 110, a NOR gate 111 and an AND gate 112. The stages Q12 and Q17 of the shift register 109 are combined by the gating circuits 110-112 to provide three non-overlapping window signals. The combined time intervals of each window signal is one bit interval. A good window signal is provided by NOR gate 111 and is substantially centered about expected bit transitions. A bad window signal is provided by AND gate 112 and is centered in quadrature with expected bit transitions. A marginal window signal is provided by EXCLUSIVE OR gate 110 and is located between the good and bad window signals. The marginal window signal has two intervals per bit interval. The relative positions of the waveforms of the good, bad and marginal window signals are illustrated in FIG. 2.

The bit transition pulse generating circuitry 113-114 includes a two stage shift register 113 and an EXCLUSIVE OR gate 114. The digital signal is serially passed through the shift register 113 in response to the high speed clock signal. The stages Q1 and Q2 of the shift register 113 are coupled to EXCLUSIVE OR gate 114. A bit transition pulse is provided by EXCLUSIVE OR gate 114 if stages Q1 and Q2 have opposite logical stages. Stages Q1 and Q2 will have opposite logical states when there is a bit transition in the digital signal.

The bit-transition counting circuitry 115-117 includes an 8 stage up-down counter 115, an EXCLUSIVE OR gate 116 and a delay flip-flop 117, which together provide a 9 stage up-down counter. The counting circuitry 115-117 provides in accordance with the window signals 110 to 112 a totallized count of the number of bit transitions occurring between successive reset pulse signals. If a bit transition occurs during the good window signal 111, the counting circuitry 115-117 is enabled to count up by one. If a bit transition occurs during the bad window signal 112, the counting circuitry 115-117 is enabled to count down by one. If a bit transition occurs during the marginal window signal 110, the counting circuitry 115-117 holds its present totallized count, being neither enabled to count up nor enabled to count down. When the counting circuitry 115-117 has reached its maximum totallized count, flip-flop 117 changes logical state, $\overline{Q}$ changing from 0 to 1 for providing a detect signal indicating that the digital signal has been detected.

While only three window signals 110 to 112 have been shown in the preferred embodiment, any number of window signals can be utilized in practicing the present invention. The weighted value assigned to each window signal may be any suitable value, selected on the basis of the statistical characteristics of the particular communication channel utilized for transmission of the digital signal. In the preferred embodiment, the weighted values of 1, 0 and −1 for the good, marginal and bad window signals, respectively, may be appropriately adjusted to meet the statistical requirements of a particular communication channel.

Moreover, the good and bad window signals may have equal time intervals, such that a pure noise input will yield a mean change of zero in the totallized count. Thus, when bit transitions are distributed substantially equally throughout the good and bad window signals, the counting circuitry 115-117 will remain reasonably close to its initialized value. The counting circuitry 115-117 will count up toward its maximum count only if the number of bit transitions occurring in the good window interval are greater than the number of bit transitions occurring during the bad window interval. Thus, with a pure digital signal, all of the bit transitions will occur during the good window interval and none will occur during the bad window interval. As the signal-to-noise ratio of the digital signal decreases, the bit transitions will tend to be more evenly distributed over the good and bad window intervals.

In order to accommodate various signal-to-noise ratios in the digital signal, the counting circuitry 115–117 may be loaded with a threshold count. The higher the threshold count, the less noise the digital signal may have and still be detected. However, the lower the threshold count, the higher the probability of false detection due to noise and other interfering signals. Since each communication channel exhibits different characteristics, statistical measurements may be taken with various signal-to-noise ratios in order to determine empirically an optimum threshold count. Once an optimum threshold count has been determined, the statistical distribution of bit transitions is well behaved in the particular communication channel. In addition, for each quadrupling of the time interval between reset pulse signals, the threshold count need only double in order to maintain the same probability of falsing. Thus, a design trade off can be made beween the length of the time interval and the desired falsing rate in order to obtain an acceptable level of sensitivity for a particular communication channel.

The threshold count may be provided by parallel loading the counter 115 and flip-flop 117 in response to the reset pulse signal. The parallel load inputs of counter 115 are designated P1–P8. In the preferred embodiment, counter 115 is loaded with an initial binary count, 10111011 and flip-flop 117 is preset, which corresponds to an initial decimal count of −69. Thus, a detect signal is provided by flip-flop 117 when 69 bit transitions have been totallized.

Furthermore, once the threshold count of 69 has been achieved, hysteresis may be provided by lowering the threshold count thereafter. Thus, when at the end of a time interval flip-flop 106 changes state, the P6 and P7 parallel inputs to counter 115 are provided with opposite states. The effect produced is that the initial binary count is now 11011011, which yields a detect signal at the output of flip-flop 117 for 37 counts. Therefore in order to maintain the detect signal at the output of flip-flop 117, only 37 bit transitions, instead of 69 bit transitions, are required in each subsequent time interval.

The hysteresis of the digital signal detector is a very important feature which greatly reduces intermittent transitions of the detector output signal when receiving marginal quality signals over a communication channel. The amount of hysteresis can be further tailored to the particular communication channel. The hysteresis substantially reduces intermittent loss of the detector output signal from flip flop 106 when the signal-to-noise ratio of the digital signal is varying above and below the signal-to-noise ratio represented by the threshold count of 69, but is higher than the signal-to-noise ratio represented by the threshold count of 37.

The counting circuitry 115–117 not only will detect pseudorandom data, but also will detect periodic signals whose frequencies are harmonically related to the bit frequency. Periodic signals having a period that is 2 N times the period of the bit frequency will also produce a detect signal from flip-flop 117. However, depending on the selection of the threshold count, periodic signals below a predetermined frequency do not have sufficient bit transitions to produce a detect signal. Thus, for the preferred embodiment, only those periodic signals (e.g. 6 KHz, 3 KHz, 2 KHz) that have at least 69 bit transitions in one time interval need be detected. The periodic signal detecting circuitry 101–104 provides for detection of those periodic signals which produce a detect signal from flip-flop 117.

The periodic signal detecting circuitry 101–104 includes a 64 stage shift register 101, an EXCLUSIVE OR gate 102 and a 7 stage counter 103–104. Stages Q4 and Q64 of the shift register 101 are combined by EXCLUSIVE OR gate 102, whose output enables the 4 stage counter 103. If the 7 stage counter 103–104 is enabled by the EXCLUSIVE OR gate output, the marginal window signal 112 clocks the 4 stage counter 103, incrementing the totallized count by one for each bit interval that the counter 103 is enabled. The 7 stage counter 103–104 totallizes the counts between successive reset pulses. A maximum of 64 counts may be totallized. If the digital signal is correlated between stages Q4 and Q64, the 7 stage counter will accumulate very few counts. Thus, if less than 64 counts are totallized, the digital signal is considered to be correlated, or is found to contain a periodic signal. However, if the digital signal is not correlated between stages Q4 and Q64 of the shift register 101, the count will be greater than 64, thus indicating the presence of non-periodic signals. When 7 stage counter 103–104 reaches a count of 64, stage Q3 of counter 104 changes to a logic high to disable counter 104 from accumulating further counts (i.e. until the next reset pulse signal resets the counter 104).

The selection of the stages Q4 and Q64 of shift register 101 will determine which submultiple frequencies will be detected. The submultiple frequencies must all be correlated between stages Q4 and Q64. First, the least common multiple of the factors 2 N for each of the submultiple frequencies is determined, where each submultiple frequency has a period that is 2 N times the period of the clock signal. Next, upon selection of the first stage, such as Q4, the submultiple frequencies will be correlated between stage Q4 and stage Q4+LCM ($2N_1$, $2N_2$, $2N_3$...), where LCM is the least common multiple. Furthermore, the periodic signals will also be correlated between state Q4 and stage Q4+K*LCM ($2N_1$, $2N_2$, $2N_3$...). For the preferred embodiment of FIG. 1, the clock signal is 12 KHz and the submultiple frequencies to be detected are 6 KHz, 3 KHz and 2 KHz, where N=1, 2 and 3, respectively. Thus, the second stage of the shift register may be chosen to be the first stage plus K times the LCM (2,4,6), or K*12. If the first stage is Q4, then the second stage may be Q(4+K*12), or Q16, Q28, Q40, Q52, Q64, etc. Therefore, for register 101 stages Q4 and Q64 were chosen. The periodic signal at 1.5 KHz and all lower frequency periodic signals will not produce a detect signal from flip-flop 117 since they do not produce a sufficient number of bit transitions (i.e. 69 or more bit transitions) in the time interval between reset pulse signals.

The detector output circuitry 105–106 receives the indication signals from the bit transition detecting circuitry 109–117 and periodic signal detecting circuitry 101–104 and provides the detector output signal, having a logic high state indicating the detection of a random digital signal. If a random signal is present, flip-flop 117 and counter 104 each provide a logic high to AND gate 105. Then at the low to high transition of the reset pulse signal, the Q output of flip-flop 106 is clocked to a logic high state. As previously mentioned, the change in state of the flip-flop 106 provides hysteresis by reducing the threshold count of counter 115 when its Q output changes from a logic low to a logic high state. Conversely, the threshold count of counter 115 is raised when the Q output of flip-flop 106 changes from a logic high to a logic low state.

Since flip-flop 106 is clocked by the reset pulse signal, its Q output may only change state at the end of each time interval. Thus, counter 103 and 104 must accumulate at least 64 counts in each time interval, and counter 115 at least 69 counts in the initial time interval and 37 in each subsequent time interval to maintain the Q output of flip-flop 106 in the logic high state. Further circuitry may be utilized to debounce the Q output of flip-flop 106 if intermittent transitions thereon are to be ignored. As previously mentioned, the detector output signal from the Q output of flip-flop 106 may be advantageously utilized as the data squelch signal in a receiver that receives both analog signals and digital signals. In addition, the detector output signal may be taken directly from the Q output of flip-flop 117, if falsing due to periodic signals may be tolerated, or if periodic signals do not occur on the communication channel.

The digital signal detector of FIG. 1 may be realized from conventional integrated circuits, such as CMOS integrated circuits described in "The Semiconductor Data Library/CMOS", Vol. 5, published by Motorola Semiconductor Products, Inc., 1976. For example, the shift register 101 may be realized with the MC14015 and MC14517, shift register 109 the MC14006, shift register 113 the MC14015, counters 103–104 two cascaded MC14520's, counter 115 two cascaded MC14516's, flip-flops 106, 108, 117 the MC14013, EXCLUSIVE OR gates 102, 110, 114, 116 the MC14070, NOR gate 111 the MC14001, AND gates 105, 112 the MC14081 and inverting gate 100 the MC14049. Furthermore, the digital signal detector may be readily integrated onto an integrated circuit substrate using any suitable integration technique known in the art.

We claim:

1. A detector for a digital signal transmitted in a serial bit stream at a predetermined bit frequency by a clock signal, comprising:
   first counting means responsive to the clock signal for providing a reset pulse signal at the end of each N bit interval, where N is an integer;
   transition detection means responsive to the digital signal and the clock signal for providing a transition pulse signal for each change in logical state between successive bits of the digital signal;
   window generating means responsive to the clock signal for repetitively generating during each bit interval a plurality of window signals, each window signal having a corresponding predetermined value that is predeterminedly related to the probability of bit transitions occurring in the interval of the respective window signal;
   second counting means responsive to the reset pulse signals and transition pulse signals for providing for each N bit interval, a totallized count formed by totallizing for each transition pulse signal, the predetermined value corresponding to the window signal during which the respective transition pulse signal occurs; and
   means for comparing each totallized count from the second counting means to a first threshold count and providing an indication signal indicating that the digital signal is present when the respective totallized count is greater than the first threshold count.

2. The digital signal detector according to claim 1, wherein the window generating means generates at least first, second and third nonoverlapping window signals, the first window signal substantially centered about the transition of the clock signal that is in synchronism with the bit transitions of the digital signal, the second window signal substantially centered about the transition of the clock signal that is in quadrature with the bit transitions of the digital signal, the third window signal disposed between the first and second window signals.

3. The digital signal detector according to claim 2, wherein the intervals of the first and second window signals are substantially identical, and the interval of the third window signal is smaller than the intervals of the first and second window signals.

4. The digital signal detector according to claim 2, wherein the interval of the first window signal is greater than the intervals of the second and third window signals, and the interval of the second window signal is greater than the interval of the third window signal.

5. The digital signal detector according to claim 2, wherein the interval of the first window signal includes the portion of each bit interval for which the probability of bit transitions is greater than a first threshold probability; the interval of the third window signal includes the portion of each bit interval for which the probability of bit transitions is less than the first threshold probability and greater than a second threshold probability, where the first threshold probability is greater than the second threshold probability; and the interval of the second window signal includes the portion of each bit interval for which the probability of bit transitions is less than the second threshold probability.

6. The digital signal detector according to claim 1, wherein the comparing means includes means for providing a second threshold count less than the first threshold count for comparisons subsequent to a comparison where the totallized count is greater than the first threshold count.

7. The digital signal detector according to claim 3, wherein the first window signal has a corresponding value of $+1$, the second window has a corresponding value of $-1$ and the third window signal has a corresponding value of zero.

8. The digital signal detector according to claim 1, further including means for detecting a plurality of periodic signals in the bit stream at submultiple frequencies of the bit frequency, the period of the periodic signals being 2 N times the period of the bit frequency, where N is an integer, said periodic signal detecting means including:
   first register means having a predetermined number of stages, the first register means responsive to the clock signal for serially receiving the digital signal and providing at least first and second delayed bits, $B_I$ and $B_{I+M}$, respectively, the first delayed bit $B_I$ provided by stage I, and the second delayed bit $B_{I+M}$ provided by stage I+M, stage I+M delayed by M bits relative to stage I, where I is an integer and M is the lowest common multiple of the factors 2 N for each of the periodic signals;
   gating means for combining the first and second delayed bits to provide an output signal when the first and second delayed bits have the same logical state; and third counting means responsive to the clock signal, reset pulse signal and output signals of the gating means for providing totallized counts of the gating-means output signals occurring between successive reset pulse signals; and said comparing means further comparing each totallized count from the third counting means to a third reference count and providing an indication signal indicating that a periodic signal is present when the respective totallized count is greater than the third threshold count.

9. The digital signal detector according to claim 8, wherein the second delayed bit of the first register means is delayed relative to the first delayed bit by a predetermined multiple of M stages.

10. The digital signal detector according to claim 1, further including means for detecting a plurality of periodic signals in the bit stream at submultiple frequencies of the bit frequency, the period of the periodic signals being 2 N times the period of the bit frequency, where N is an integer, said periodic signal detecting means including:

first register means having a predetermined number of stages, the first register means responsive to the clock signal for serially receiving the digital signal and providing at least first and second delayed bits, $B_I$ and $B_{I+M}$, respectively, the first delayed bit $B_I$ provided by stage I, and the second delayed bit $B_{I+M}$ provided by stage I+M, stage I+M delayed by M bits relative to stage I, where I is an integer and M is the lowest common multiple of the factors 2 N for each of the periodic signals;

gating means for combining the first and second delayed bits to provide an output signal when the first and second delayed bits have the opposite logical state; and third counting means responsive to the clock signal, reset pulse signal and output signals of the gating means for providing totallized counts of the gating-means output signals occurring between successive reset pulse signals; and said comparing means further comparing each totallized count from the third counting means to a third reference count and providing an indication signal indicating that a periodic signal is present when the respective totallized count is less than the third threshold count.

11. The digital signal detector according to claim 10, wherein the second delayed bit of the first register means is delayed relative to the first delayed bit by a predetermined multiple of M stages.

12. The digital signal detector according to claim 8 or 10, further including a semiconductive substrate, said digital signal detector comprised of electrical circuit elements integrated into the semiconductive substrate.

13. The digital signal detector according to claim 1, wherein said window generating means generates at least first and second predeterminedly overlapping window signals, the first window signal substantially centered about the transition of the clock signal that is in synchronism with the bit transitions of the digital signal, and the second window signal substantially centered about the transition of the clock signal that is in quadrature with the bit transitions of the digital signal.

14. The digital signal detector according to claim 13, wherein said second counting means includes first and second transition counters; the first transition counter incremented by the predetermined value corresponding to the first window signal for each transition pulse signal occurring during the interval of the first window signal; and the second transition counter incremented by the predetermined value corresponding to the second window signal for each transition pulse signal occurring during the interval of the second window signal; and said comparing means including means for comparing for each N bit interval the totallized counts of the first and second transition counters and providing the indication signal when the totallized count of the first transition counter is greater than the totallized count of the second transition counter.

15. The digital signal detector according to claim 14, wherein said comparing means provides the indication signal when the totallized count of the first transition counter is greater than the totallized count of the second transition counter by a predetermined amount.

16. A detector for a digital signal transmitted in a serial bit stream at a predetermined bit frequency by a clock signal, comprising:

first counting means responsive to the clock signal for providing a reset pulse signal at the end of each N bit interval, where N is an integer;

transition detection means responsive to the digital signal and the clock signal for providing a transition pulse signal for each change in logical state between successive bits of the digital signal;

window generating means responsive to the clock signal for repetitively generating during each bit interval at least first, second and third non-overlapping window signals, the first window signal substantially centered about the transition of the clock signal that is in synchronism with the bit transitions of the digital signal, the second window signal substantially centered about the transition of the clock signal that is in quadrature with the bit transitions of the digital signal, the third window signal disposed between the first and second window signals, the intervals of the first and second window signals being substantially identical, and the interval of the third window signal being smaller than the intervals of the first and second window signals, the first window signal having a corresponding value of +1, the second window having a corresponding value of −1 and the third window signal having a corresponding value of zero;

second counting means responsive to the reset pulse signals and transition pulse signals for providing for each N bit interval, a totallized count formed by totallizing for each transition pulse signal, the value corresponding to the window signals during which the respective transition pulse signal occurs; and means for comparing each totallized count from the second counting means to a first threshold count and providing an indication signal indicating that the digital signal is present when the respective totallized count is greater than the first threshold count.

17. The digital signal detector according to claim 16, wherein the comparing means includes means for providing a second threshold count less than the first threshold count for comparisons subsequent to a comparison where the totallized count is greater than the first threshold count.

18. The digital signal detector according to claim 17, further including means for detecting a plurality of periodic signals in the bit stream at submultiple frequencies of the bit frequency, the period of the periodic signals being 2 N times the period of the bit frequency, where N is an integer, said periodic signal detecting means including:

first register means having a predetermined number of stages, the first register means responsive to the clock signal for serially receiving the digital signal and providing at least first and second delayed bits, $B_I$ and $B_{I+M}$, respectively, the first delayed bit $B_I$ provided by stage I, and the second delayed bit $B_{I+M}$ provided by stage I+M, stage I+M delayed by M bits relative to stage I, where I is an integer and M is the lowest common multiple of the factors 2 N for each of the periodic signals;

gating means for combining the first and second delayed bits to provide an output signal when the first and second delayed bits have the same logical state; and third counting means responsive to the clock signal, reset pulse signal and output signals of the gating means for providing totallized counts of the gating-means output signals occurring between successive reset pulse signals; and said comparing means further comparing each totallized count from the third counting means to a third reference count and providing an indication signal indicating that a periodic signal is present when the respective totallized count is greater than the third threshold count.

19. The digital signal detector according to claim 17, further including means for detecting a plurality of periodic signals in the bit stream at submultiple frequencies of the bit frequency, the period of the periodic signals being 2 N times the period of the bit frequency, where N is an integer, said periodic signal detecting means including:

first register means having a predetermined number of stages, the first register means responsive to the clock signal for serially receiving the digital signal and providing at least first and second delayed bits, $B_I$ and $B_{I+M}$, respectively, the first delayed bit $B_I$ provided by stage I, and the second delayed bit $B_{I+M}$ provided by stage I+M, stage I+M delayed by M bits relative to stage I, where I is an integer and M is the lowest common multiple of the factors 2 N for each of the periodic signals;

gating means for combining the first and second delayed bits to provide an output signal when the first and second delayed bits have the opposite logical state; and third counting means responsive to the clock signal, reset pulse signal and output signals of the gating means for providing totallized counts of the gating-means output signals occurring between successive reset pulse signals; and said comparing means further comparing each totallized count from the third counting means to a third reference count and providing an indication signal indicating that a periodic signal is present when the respective totallized count is less than the third threshold count.

20. The digital signal detector according to claim 18 or 19, further including a semiconductor substrate, said digital signal detector comprised of electrical circuit elements integrated into the semiconductive substrate.

* * * * *

UNITED STATES PATENT AND TRADEMARK OFFICE
CERTIFICATE OF CORRECTION

PATENT NO. : 4,197,502
DATED : April 8, 1980
INVENTOR(S) : Terence E. Sumner and Charles A. Backof, Jr.

It is certified that error appears in the above-identified patent and that said Letters Patent are hereby corrected as shown below:

Col. 5, line 17, "in" should be -- on --.

Col. 7, line 8, "counter" should be -- counters --.

Col. 7, line 20, "Q" should be -- $\bar{Q}$ --.

Col. 10, line 44, -- signal -- should be inserted after "window".

Signed and Sealed this

Fifteenth Day of July 1980

[SEAL]

Attest:

SIDNEY A. DIAMOND

Attesting Officer

Commissioner of Patents and Trademarks